(12) United States Patent
Klemp

(10) Patent No.: US 10,490,698 B2
(45) Date of Patent: Nov. 26, 2019

(54) OPTOELECTRONIC SEMICONDUCTOR CHIP AND METHOD OF PRODUCING THE SAME

(71) Applicant: OSRAM Opto Semiconductors GmbH, Regensburg (DE)

(72) Inventor: Christoph Klemp, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/514,652

(22) PCT Filed: Sep. 22, 2015

(86) PCT No.: PCT/EP2015/071721
§ 371 (c)(1),
(2) Date: Mar. 27, 2017

(87) PCT Pub. No.: WO2016/050561
PCT Pub. Date: Apr. 7, 2016

(65) Prior Publication Data
US 2017/0222088 A1    Aug. 3, 2017

(30) Foreign Application Priority Data

Sep. 30, 2014 (DE) .......... 10 2014 114 194

(51) Int. Cl.
*H01L 33/20*    (2010.01)
*H01L 33/00*    (2010.01)
(Continued)

(52) U.S. Cl.
CPC .......... *H01L 33/20* (2013.01); *H01L 33/0079* (2013.01); *H01L 33/14* (2013.01); *H01L 33/46* (2013.01)

(58) Field of Classification Search
CPC ....... H01L 33/10; H01L 33/387; H01L 33/20; H01L 33/22; H01L 33/42; H01L 33/0079;
(Continued)

(56) References Cited

U.S. PATENT DOCUMENTS 6,316,785 B1 * 11/2001 Nunoue .................. B82Y 20/00
                                                            257/103
8,343,788 B2 *  1/2013 Kuo .................. H01L 31/02363
                                                        257/E21.214
(Continued)

FOREIGN PATENT DOCUMENTS

CN    102479887 A    5/2012
CN    104022202      9/2014
(Continued)

OTHER PUBLICATIONS

Chinese Examination Report dated May 5, 2018, of corresponding Chinese Application No. 201580053117.9, along with an English summary.
(Continued)

*Primary Examiner* — Edward Chin
(74) *Attorney, Agent, or Firm* — DLA Piper LLP (US)

(57) ABSTRACT

An optoelectronic semiconductor chip includes a semiconductor layer sequence and a carrier substrate, wherein the semiconductor layer sequence includes a first semiconductor region of a first conductivity type, a second semiconductor region of a second conductivity type and an active layer arranged between the first semiconductor region and the second semiconductor region, wherein the first semiconductor region faces the carrier substrate, the semiconductor layer sequence includes first recesses formed in the first semiconductor region and that do not separate the active layer, the semiconductor layer sequence includes second recesses that at least partially separate the first semiconductor region and the active layer, and the second recesses
(Continued)

adjoin a first recess or are arranged between two first recesses.

11 Claims, 11 Drawing Sheets

(51) Int. Cl.
*H01L 33/14* (2010.01)
*H01L 33/46* (2010.01)

(58) Field of Classification Search
CPC ..... H01L 33/405; H01L 33/44; H01L 27/156; H01L 33/00; H01L 33/02; H01L 33/24; H01L 33/38
See application file for complete search history.

(56) References Cited

U.S. PATENT DOCUMENTS

| | | | | |
|---|---|---|---|---|
| 8,604,497 B2* | 12/2013 | Eisert | ............... | H01L 33/20 257/100 |
| 9,620,680 B2* | 4/2017 | Engl | ............... | H01L 33/382 |
| 2001/0012047 A1* | 8/2001 | Osawa | ............... | B41J 2/45 347/241 |
| 2002/0017652 A1* | 2/2002 | Illek | ............... | H01L 33/0079 257/95 |
| 2003/0071272 A1* | 4/2003 | Faska | ............... | H01L 21/76898 257/99 |
| 2008/0315228 A1* | 12/2008 | Krames | ............... | H01L 33/46 257/98 |
| 2011/0241045 A1* | 10/2011 | Ye | ............... | H01L 33/20 257/98 |
| 2011/0260203 A1 | 10/2011 | Lin et al. | | |
| 2014/0239341 A1 | 8/2014 | Matsumura | | |
| 2015/0311387 A1* | 10/2015 | Heikman | ............... | H01L 33/10 257/88 |

FOREIGN PATENT DOCUMENTS

| | | | |
|---|---|---|---|
| DE | 10 2008 032 318 A1 | 10/2009 | |
| JP | 2927158 B2 | 5/1999 | |
| JP | 2006-344710 A | 12/2006 | |
| KR | 2008-0079844 A | 9/2008 | |
| WO | 02/13281 A1 | 2/2002 | |
| WO | WO 2017213455 A1 * | 12/2017 | ............ H01L 33/00 |
| WO | WO-2017213455 A1 * | 12/2017 | ............ H01L 33/06 |

OTHER PUBLICATIONS

Chinese Examination Report dated Jan. 21, 2019, of counterpart Chinese Application No. 201580053117.9, along with an English translation.

* cited by examiner

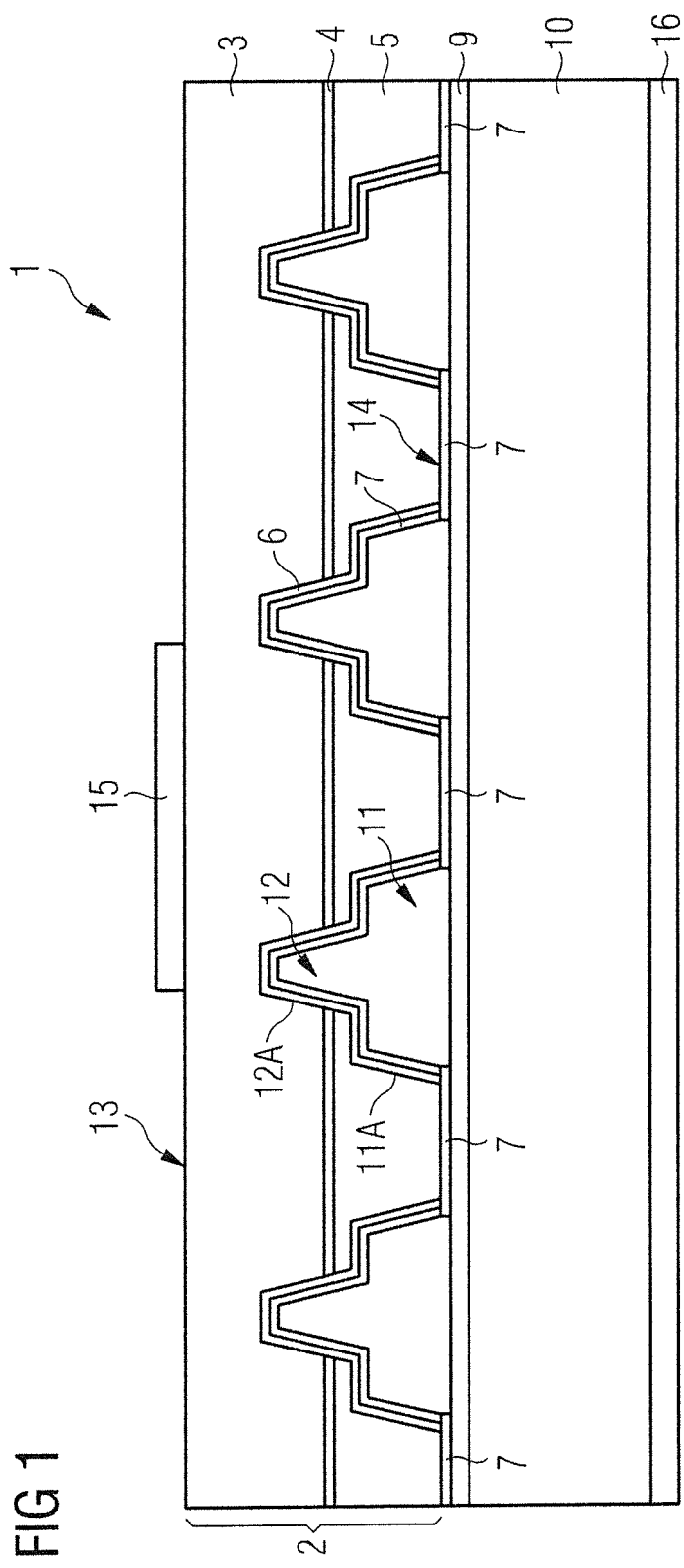

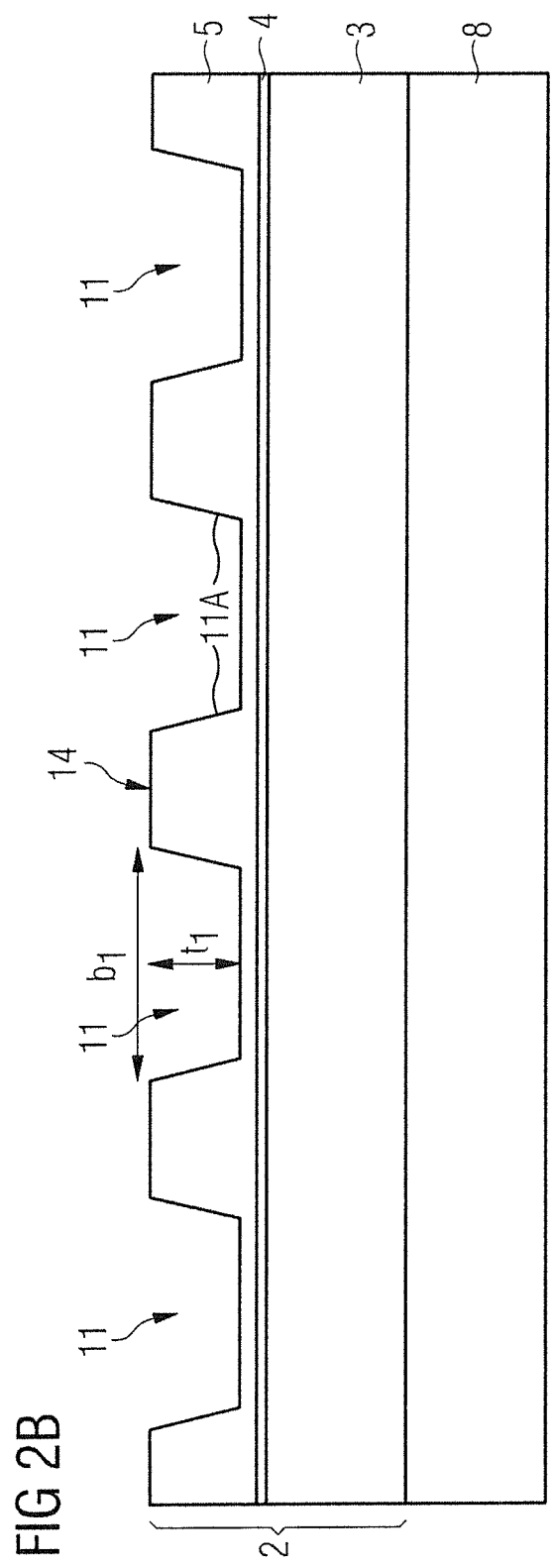

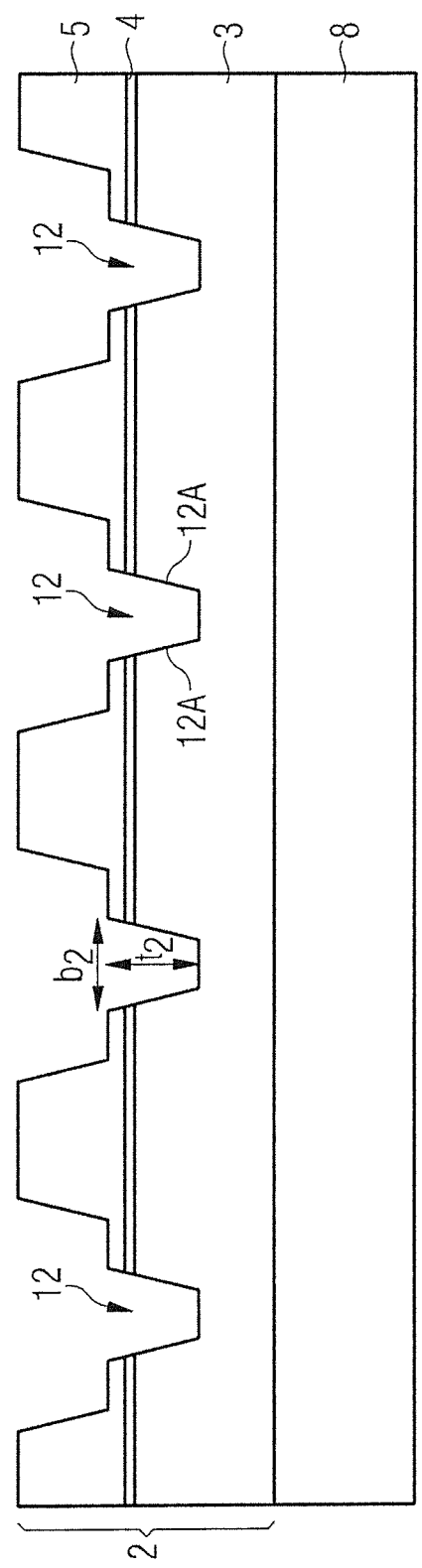

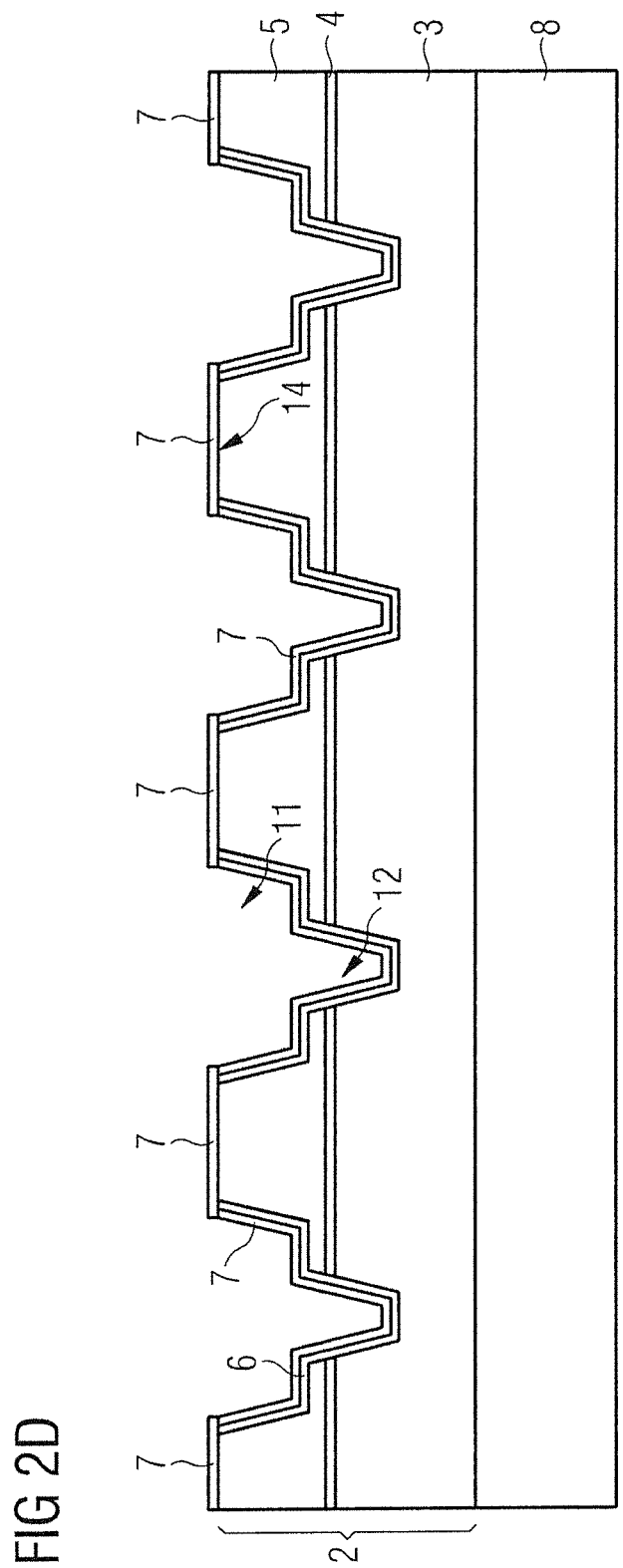

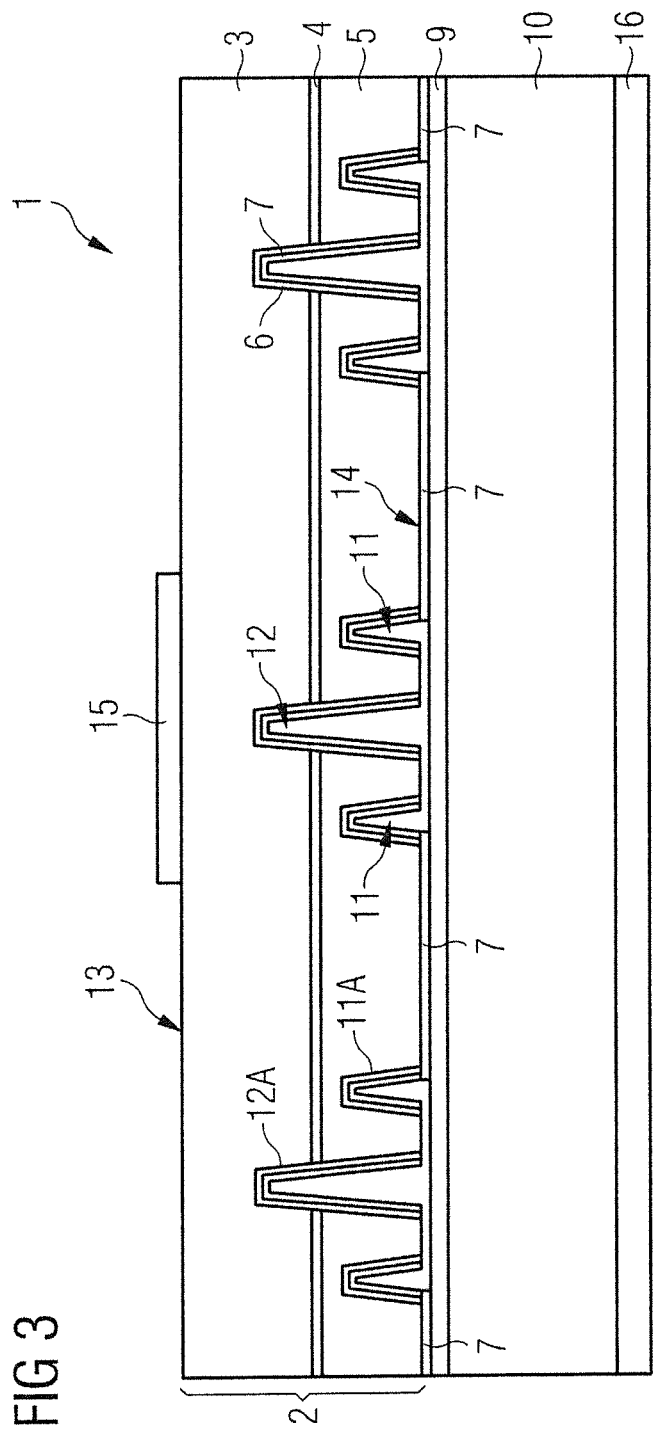

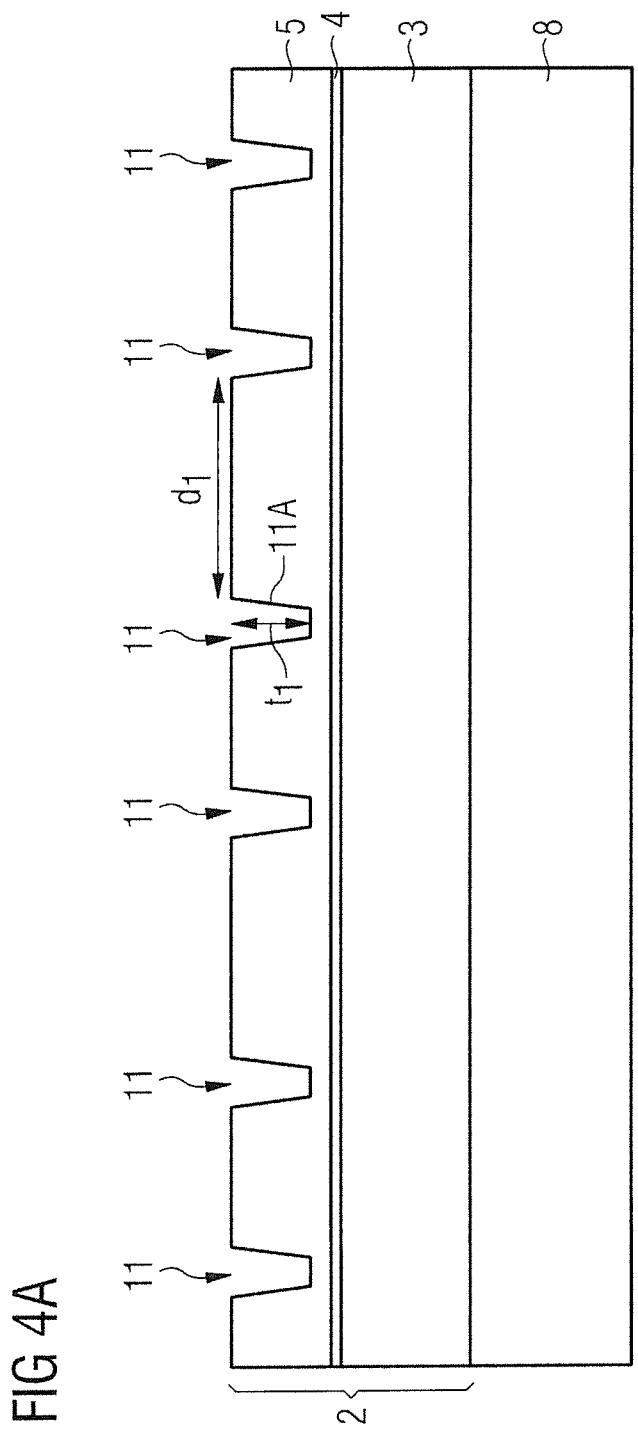

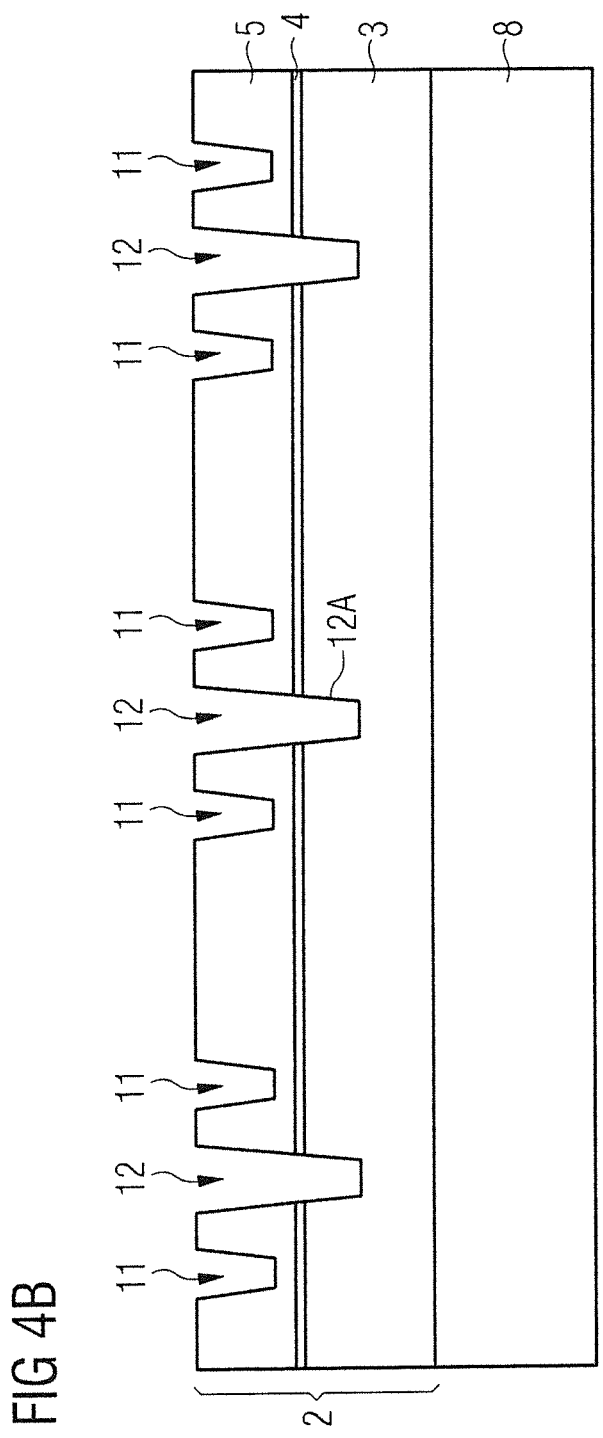

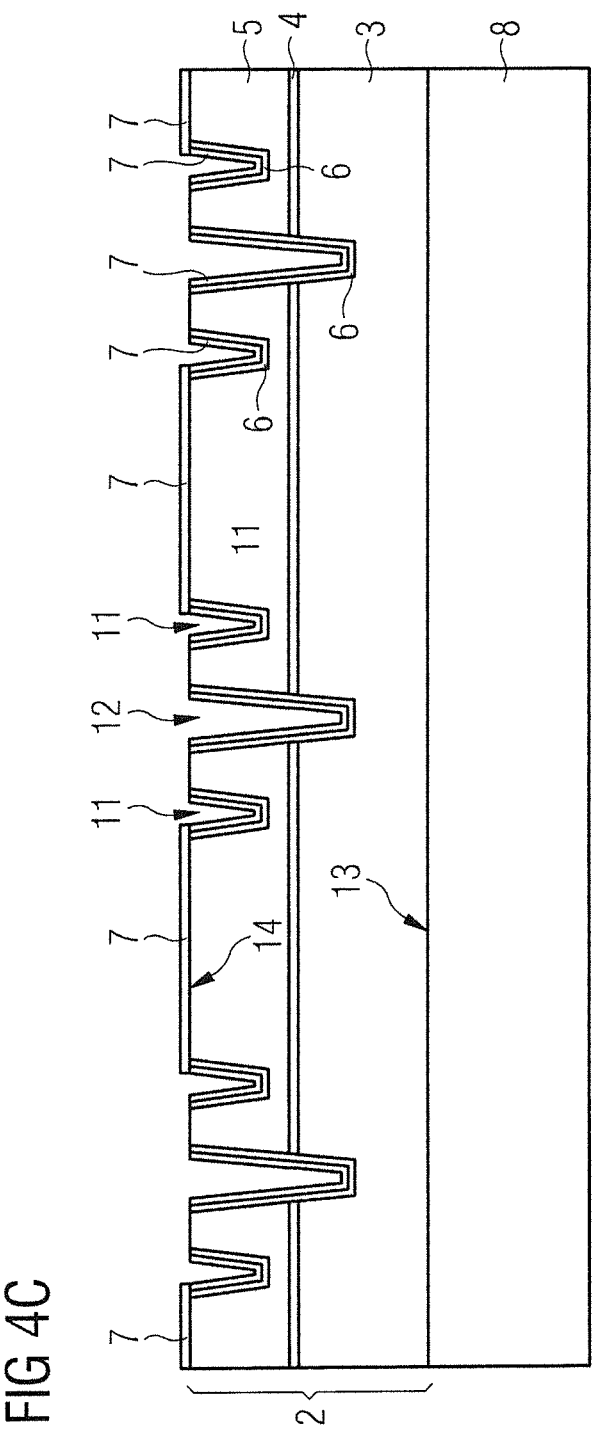

OPTOELECTRONIC SEMICONDUCTOR CHIP AND METHOD OF PRODUCING THE SAME

TECHNICAL FIELD

This disclosure relates to an optoelectronic semiconductor chip and a method of producing the same.

BACKGROUND

WO 02/13281 A1 discloses an optoelectronic semiconductor chip comprising a semiconductor layer sequence attached to a carrier substrate, wherein recesses extend into the semiconductor layer sequence from the direction of the carrier substrate, and the recesses extend through a first semiconductor region facing the carrier substrate and through the active layer of the semiconductor layer sequence. In this way, out-coupling efficiency is increased in the optoelectronic semiconductor chip. In particular, side surfaces are created by the recesses in the semiconductor layer sequence, on which part of the radiation emitted by the active layer is reflected such that when it impinges the radiation exit surface facing away from the carrier substrate, the radiation impinges within an exit cone and is thus not totally reflected at the radiation exit surface.

The out-coupling efficiency of that semiconductor chip increases due to the recesses arranged between the carrier substrate and the active layer, but on the other hand non-radiating re-combinations of charge-carriers occur in the regions where the recesses penetrate the active layer, with the non-radiating re-combinations reducing the efficiency of radiation generation. In this way, the radiation yield increased by the increased out-coupling efficiency of the optoelectronic semiconductor chip can be partially undone again.

It could therefore be helpful to provide an improved optoelectronic semiconductor chip, characterized by an improved out-coupling efficiency and a reduction of non-radiating re-combinations of charge carriers, and an advantageous method of producing the semiconductor chip.

SUMMARY

I provide an optoelectronic semiconductor chip including a semiconductor layer sequence and a carrier substrate, wherein the semiconductor layer sequence includes a first semiconductor region of a first conductivity type, a second semiconductor region of a second conductivity type and an active layer arranged between the first semiconductor region and the second semiconductor region, wherein the first semiconductor region faces the carrier substrate, the semiconductor layer sequence includes first recesses formed in the first semiconductor region and that do not separate the active layer, the semiconductor layer sequence includes second recesses that at least partially separate the first semiconductor region and the active layer, and the second recesses adjoin a first recess or are arranged between two first recesses.

I also provide a method of producing an optoelectronic semiconductor chip, including applying a semiconductor layer sequence to a growth substrate, wherein the semiconductor layer sequence includes a first semiconductor region of a first conductivity type, a second semiconductor region of a second conductivity type and an active layer arranged between the first semiconductor region and the second semiconductor region, wherein the second semiconductor region faces the growth substrate, forming first recesses in the first semiconductor region by a first etching process, wherein the first recesses do not separate the active layer, forming second recesses that separate the active layer by a second etching process, wherein the second recesses adjoin a first recess or are arranged between two first recesses, and wherein the first recesses and the second recesses include oblique side surfaces, connecting the semiconductor layer sequence with a carrier substrate such that the recesses face the carrier substrate, and removing the growth substrate.

I further provide an optoelectronic semiconductor chip including a semiconductor layer sequence and a carrier substrate, wherein the semiconductor layer sequence includes a first semiconductor region of a first conductivity type, a second semiconductor region of a second conductivity type and an active layer arranged between the first semiconductor region and the second semiconductor region, wherein the first semiconductor region faces the carrier substrate, the semiconductor layer sequence includes first recesses formed in the first semiconductor region and that do not separate the active layer, the semiconductor layer sequence includes second recesses that at least partially separate the first semiconductor region and the active layer, the second recesses adjoin a first recess or are arranged between two first recesses, and the first recesses and the second recesses include oblique side surfaces.

BRIEF DESCRIPTION OF THE DRAWINGS

FIG. 1 is a schematic illustration of a cross-section through an optoelectronic semiconductor chip according to a first example.

FIGS. 2A to 2E are schematic illustrations of a method of producing the optoelectronic semiconductor chip according to the first example by intermediate steps.

FIG. 3 is a schematic illustration of a cross-section through an optoelectronic semiconductor chip according to a second example.

FIGS. 4A to 4D are schematic illustrations of a method of producing the optoelectronic semiconductor chip according to the second example by intermediate steps.

DETAILED DESCRIPTION

Figure 2A:
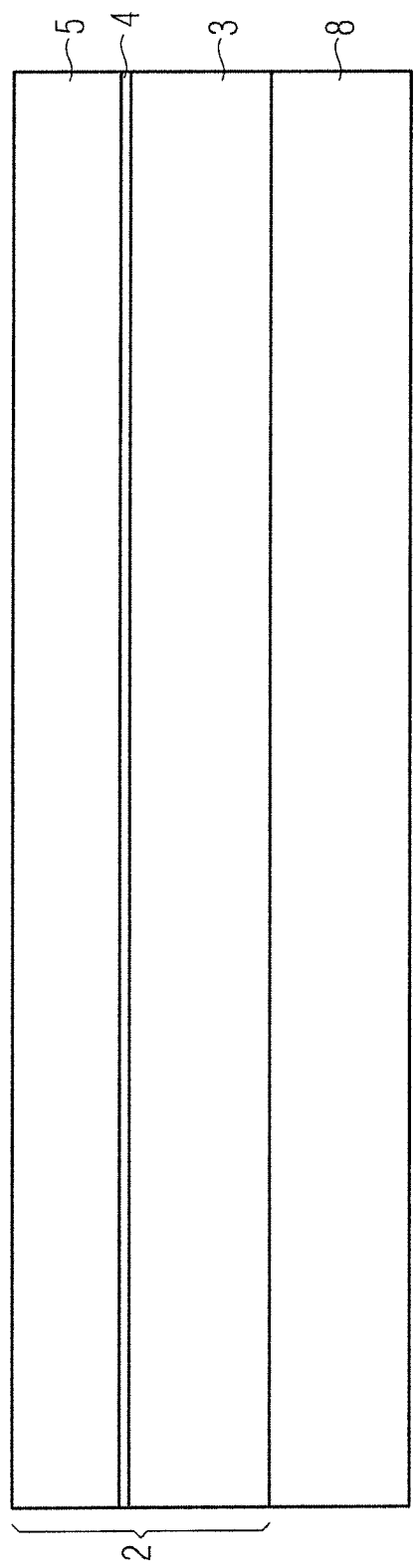

The optoelectronic semiconductor chip may contain a semiconductor layer sequence and a carrier substrate. In particular, the semiconductor layer sequence may be an epitaxially-produced semiconductor layer sequence. The semiconductor layer sequence may comprise a first semiconductor region of a first conductivity type, a second semiconductor region of a second conductivity type and an active layer arranged between the first semiconductor region and the second semiconductor region. The first semiconductor region faces the carrier substrate and preferably is a p-type semiconductor region. The second semiconductor region can face a radiation exit surface of the semiconductor chip and preferably is an n-type semiconductor region.

Preferably, the optoelectronic semiconductor chip is a so-called thin-film semiconductor chip in which the original growth substrate is removed from the semiconductor layer sequence and the semiconductor layer sequence connects to the growth substrate on the side opposite the original growth substrate. The carrier substrate of the semiconductor chip is in particular not the growth substrate used to grow the semiconductor layer sequence.

In the optoelectronic semiconductor chip, the semiconductor layer sequence advantageously comprises first recesses formed in the first semiconductor region and do not separate the active layer. In particular, the first recesses extend from the direction of the carrier substrate into the first semiconductor region without reaching the active layer.

Furthermore, the semiconductor layer sequence advantageously comprises second recesses that separate the first semiconductor region and the active layer. Preferably, the second recesses adjoin a first recess or are arranged between two first recesses.

The first recesses and second recesses in the semiconductor layer sequence advantageously improve the radiation out-coupling from the semiconductor chip. Interfaces are produced in the semiconductor layer sequence by forming the recesses in the semiconductor layer sequence on which interfaces the radiation generated in the active layer is at least partially reflected such that, when the radiation impinges on the radiation out-coupling surface of the optoelectronic semiconductor chip, this radiation is not totally reflected and is thus out-coupled from the optoelectronic semiconductor chip.

The recesses may in particular comprise side surfaces that run obliquely, i.e., not in parallel or perpendicular to a main extension plane of the semiconductor layer sequence. In particular, these recesses have an effect that multiple total reflections of radiation on parallel interfaces of the semiconductor layer sequence are reduced.

To increase the out-coupling efficiency, it is advantageous for the second recesses to extend through the active layer since this way, it is achieved in particular that in the active layer, radiation emitted in lateral direction can be deflected by reflection on the side surfaces of the recesses in the direction toward the radiation exit surface. The second recesses can in particular extend through at least a part of the first semiconductor region, through the active layer and a part of the second semiconductor region.

Due to the fact that the second recesses in the optoelectronic semiconductor chip adjoin a first recess or are arranged between two first recesses, wherein the first recesses do not separate the active layer, advantageously non-radiating re-combinations in regions of the active layer adjoining the second recess, are reduced. The thickness of the first semiconductor region in the region of the second recesses is reduced by the first recesses directly adjoining the second recesses or being arranged next to the second recesses. This reduces the flow of current in a lateral direction in the first semiconductor region in the region of the second recesses. In this way, the flow of current through the active layer in the region of the second recesses is reduced. This is advantageous because non-radiating re-combinations may occur more often in the region of the second recess due to imperfections in the semiconductor material. Reducing the current flow through the region thus decreases the number of non-radiating re-combinations that would decrease the quantum efficiency of the semiconductor chips. The optoelectronic semiconductor chip described herein is thus characterized by a high out-coupling efficiency as well as high quantum efficiency.

Advantageously, the first recesses and/or second recesses may have a depth of 0.1 μm to 10 μm, preferably 0.25 μm to 2.5 μm.

The second recesses may adjoin the first recesses in a vertical direction, i.e., in a direction running perpendicular to the semiconductor layer sequence. The second recesses may be arranged between two first recesses when viewed from a lateral direction and directly extend from a main surface facing the carrier substrate of the semiconductor layer sequence into the semiconductor layer sequence.

Advantageously, the first recesses and/or second recesses comprise a cross-sectional area that reduces in a direction facing away from the carrier substrate. In other words, a cross-sectional area of the first recesses and/or second recesses tapers in a vertical direction pointing from the carrier substrate to a radiation exit surface of the optoelectronic semiconductor chip. In this configuration, the side surfaces of the first recesses and/or second recesses run obliquely with respect to a first main surface of the semiconductor layer sequence facing the carrier substrate.

The first recesses and/or the second recesses may have a trapezoid cross-sectional area, for example. In a trapezoid cross-sectional area, the parallel basic surfaces of the trapezoid run parallel to the main plane of the semiconductor layer sequence and the non-parallel side surfaces of the trapezoid form the side surfaces of the recesses. The smaller base area of the trapezoid faces away from the substrate in this case. The first recesses and/or second recesses may in particular have the shape of a prism.

The first recesses may have a greater width than the second recesses, wherein the second recesses are subsequent to a first recess in each case in vertical direction, when viewed from the carrier substrate. In this case, the second recesses are advantageously arranged centrally with respect to the first recesses in a lateral direction. As the second recesses have a smaller width than the first recesses, a step is formed in the first semiconductor region on the side next to the second recesses in this configuration, wherein in this step-like region, the thickness of the first semiconductor region is reduced. In this region, the current flow through the active layer is reduced due to the reduced current expansion caused by the smaller thickness of the first semiconductor region. In this way, non-radiating re-combinations in this region are advantageously reduced.

The first recesses preferably have a width of 20 μm to 50 μm. The second recesses preferably have a width of 2 μm to 20 μm. Here and below, the width of the first and second recesses is in each case the width of the recesses at the widest point if the recesses have a non-constant cross-section in the vertical direction.

Preferably, the width of the first recesses is larger by at last 10 μm than the width of the second recesses. In this case, preferably on both sides of the recesses, each step having a width of at least 5 μm, preferably including 5 μm to 25 μm is formed in the first semiconductor region, wherein the thickness of the first semiconductor region is reduced by the depth of the first recess.

The second recesses may be arranged centrally in a lateral direction between two first recesses, without directly adjoining the first recesses. In this configuration, the first recesses have a distance of at least 20 μm and at most 50 μm to one another in the lateral direction. The second recesses that are preferably arranged in the center between the first recesses preferably have a width of 2 μm to 20 μm.

In the method of producing an optoelectronic semiconductor chip, the semiconductor layer sequence may be applied to a growth substrate, wherein the semiconductor layer sequence comprises a first semiconductor region of a first conductivity type, a second semiconductor region of a second conductivity type, and an active layer arranged between the first semiconductor region and the second semiconductor region and wherein the second semiconductor region faces the growth substrate.

In a further method step, first recesses are produced in the first semiconductor region by a first etching process, wherein the recesses do not separate the active layer. In a subsequent further method step, second recesses separating the active layer, are formed by a second etching process. The second recesses are produced in a way to adjoin a first recess or to be arranged between two first recesses. In the etching processes that produce the first recesses and the second recesses, each mask layer can be used to cover the areas of the semiconductor layer sequence that are not to be etched.

The semiconductor layer sequence may connect to a carrier substrate in a further method step so that the recesses are arranged on the side of the semiconductor layer sequence facing away from the carrier substrate. Connecting the semiconductor layer sequence to the carrier substrate is, for example, effected by a bonding layer such as a solder layer. It is possible that further layers are arranged between the carrier substrate and the semiconductor layer sequence, for example, a mirror layer, an electric contact layer or one or multiple further functional layers such as adhesive layers, wetting layers or barrier layers.

The growth substrate may be removed from the semiconductor layer sequence in a further step. To that end, methods known per se can be used to remove the growth substrate such as a laser lift-off method, for example.

The second recesses may each be produced in the center of a first recess in the second etching process, with the first recess being wider than the second recesses. This achieves a depression formed in the semiconductor layer sequence by the first recess that is additionally deepened in a central region by the second recess. The region of the first recess, which is not to be additionally etched in the second etching process, is preferably covered by a mask layer prior to performing the second etching process.

The second recesses may each be produced in the center between two first recesses. In this case, during the first etching process, it is possible to produce a first recess in the place of the second recess to be produced later, which first recess is arranged between two further first recesses and does not extend through the active layer. In the second etching process, a first recess arranged between two further recesses is deepened such, for example, that it extends through the active layer. The first recesses neighboring the second recess produced this way preferably have a distance to the second recess in the lateral direction of no more than 25 µm.

Further advantageous examples of the method result from the above description of the optoelectronic semiconductor chip and vice versa.

My chips and methods are described in more detail on the basis of examples in conjunction with FIGS. 1 to 4D.

Like or similar elements are denoted with like reference numerals throughout the figures. The illustrated elements as well as size ratios of the elements amongst one another are not to be considered as being to scale.

The optoelectronic semiconductor chip 1 schematically illustrated in cross-section in FIG. 1 contains a semiconductor layer sequence 2 comprising a first semiconductor region 5 of a first conductivity type and a second semiconductor region 3 of a second conductivity type. Preferably, the first semiconductor region 5 is a p-type semiconductor region and the second semiconductor region 3 is an n-type semiconductor region. An active layer 4 is arranged between the first semiconductor region 5 and the second semiconductor region 3.

The active layer 4 of the optoelectronic semiconductor chip 1 is preferably an active layer suitable for emission of radiation. The active layer 4 is configured, for example, as a p-n-junction, as a double-heterostructure, as a single quantum well structure or preferably as a multiple quantum well structure.

The semiconductor layer sequence 2 of the semiconductor chip 1 is preferably based on a III-V semiconductor compound material, in particular an arsenide or phosphide semiconductor compound material. The semiconductor layer sequence 2 may contain $In_xAl_yGa_{1-x-y}P$ or $In_xAl_yGa_{1-x-y}As$ in each case with $0 \leq x \leq 1$, $0 \leq y \leq 1$ and $x+y \leq 1$, for example. The III-V semiconductor compound material does not necessarily have to comprise a mathematically exact composition according to one of the above formulas. It may rather comprise one or more dopants as well as additional constituents that do not substantially change the physical properties of the material. For reasons of simplicity, however, the above formulas only contain the essential constituents of the crystal lattice, even if these constituents may in part be substituted by small amounts of further substances.

The optoelectronic semiconductor chip 1 comprises a carrier substrate 10 that is preferably different from the growth substrate of the semiconductor layer sequence 2 and connected to the semiconductor chip 1 by a bonding layer 9, which can in particular be a solder layer from a metal or a metal alloy. Preferably, the carrier substrate 10 is electrically conductive and also serves for electrical contacting of the first semiconductor region 5. The carrier substrate 10 preferably comprises silicon, nickel, copper or molybdenum. A first electrical connecting layer 16 can be arranged on the rear side of the carrier substrate 10, for example.

Electrical contacting of the second semiconductor region 3 is effected by a second electrical connecting layer 15 that can be configured as a bond pad, for example. The second connecting layer 15 can, for example, be arranged on a second main surface 13 of the semiconductor layer sequence 2 forming the radiation exit surface of the semiconductor chip 1. The radiation exit surface 13 preferably comprises a roughening or an out-coupling structure to improve out-coupling of radiation from the semiconductor layer sequence 2.

To further improve the radiation out-coupling from the semiconductor layer sequence 2, recesses 11, 12 are formed in the semiconductor layer sequence 2 in the example. In the example illustrated herein, recesses 11, 12 are composed of first recesses 11 and second recesses 12. Starting from a first main surface 14 of the semiconductor layer sequence 2 opposite the radiation exit surface 13, the first recesses 11 extend into the first semiconductor region 5, however, not reaching all the way to the active layer 4 and in particular not separating the active layer 4.

The second recesses 12 directly adjoin the first recesses 11 in a vertical direction and, starting from an interface of the first recesses 11 facing the active layer 4, further extend into the semiconductor layer sequence 2 such that they separate the active layer 4 and reach all the way into the second semiconductor region 3.

Interfaces 11A of the first recesses 11 facing the semiconductor layer sequence 2 and interfaces 12A of the second recesses 12 reflect at least part of the radiation emitted by the active layer 4 such that the radiation impinges the radiation exit surface 13 at an angle smaller than the critical angle of total reflection. It is particularly advantageous in this case if the side surfaces 11A, 12A of the recesses 11, 12 run obliquely to the main surfaces 13, 14 of the semiconductor layer sequence 2. The oblique side surfaces 11A, 12A may, for example, enclose an angle of 30° to 60° with the first main surface 14 of the semiconductor layer sequence 2 facing the carrier substrate 10. The reflection of the emitted radiation at the interfaces of recesses 11, 12 particularly reduces a multiple total reflection of radiation at the main surfaces 13, 14 that are parallel to one another, of the semiconductor layer sequence 2.

First recesses 11 and second recesses 12 each have a cross-sectional area that reduces in a direction pointing from the first main surface 14 to the second main surface 13. In the example shown, the cross-sectional areas of recesses 11, 12 each have the shape of a trapezoid. In particular, the recesses are configured as prisms having a trapezoidal cross-section. The prism-shaped recesses 11, 12 are each oriented such that the longer main side of the trapezoids faces the first main surface 14 and the shorter main side of the trapezoids faces the second main surface 13.

The first recesses 11 have a greater width than the second recesses 12. Preferably, the width of the first recesses 11 is 20 µm to 50 µm at the widest point, and the width of the second recesses 12 is 2 µm to 20 µm at the widest point. The width of the first recesses 11 is greater than the width of the second recesses 12, preferably by at least 10 µm, preferably by about 10 µm to 50 µm. In lateral direction, the second recesses 12 are preferably arranged centered with respect to the first recesses 11. In this way, a step is formed in each case at the boundary between the first recesses 11 and the second recesses 12, which is formed by the part of the first recess 11 not adjoining the second recess 12 and can have a width of about 5 µm to 25 µm, for example. In the region of this step, the thickness of the first semiconductor region 5 is reduced by the depth of the first recess 11. The depth of the first recesses 11 is preferably 0.1 µm to 10 µm, preferably 0.25 µm to 2.5 µm.

Due to the fact that the thickness of the first semiconductor region 5 is reduced in the step-like regions adjoining the second recesses 12 on both sides, the flow of current through the regions of the active layer 4 adjoining the second recesses 12 is reduced. This way, non-radiating re-combinations of charge carriers, which may occur in the region of the separated active layer 4 due to imperfections of the semiconductor crystal, are advantageously reduced.

The surfaces of the semiconductor layer sequence 2 adjoining the recesses 11, 12 are preferably covered by an electrically-insulating layer 6, with the electrically-insulating layer 6 being a silicon oxide layer or a silicon nitride layer, for example. Preferably, the electrically-insulating layer 6 is transparent for the emitted radiation.

Furthermore, the surfaces of the recesses 11, 12 covered by the electrically-insulating layer 6, as well as the first main surface 14 of the semiconductor layer sequence 2 facing the carrier substrate 10 are preferably covered by a mirror layer 7. Radiation emitted toward the carrier substrate 10 is advantageously reflected toward the radiation exit surface 13 by the mirror layer 7. Preferably, the mirror layer 7 is a reflecting metal layer that may in particular comprise gold, aluminum or silver. In addition to its function as a reflector, the mirror layer 7 may serve as an electrical contact layer on the first main surface 14 of the semiconductor layer sequence 2. In this case, the electrically-insulating layer 6 prevents a short-circuit of the semiconductor layer sequence 2 by the electrically-conducting mirror layer 7 on the side surfaces 12A of the second recesses 12.

One example of a method of producing the semiconductor chip 1 of FIG. 1 is explained below by FIGS. 2A to 2E.

In the intermediate step of the method illustrated in FIG. 2A, the semiconductor layer sequence 2 comprising the first semiconductor region 5, the active layer 4 and the second semiconductor region 3, has been grown onto a growth substrate 8. Growing preferably ensues epitaxially, by MOVPE, for example. The semiconductor layer sequence 2 may contain phosphide or arsenide semiconductor compound materials, for example. The first semiconductor region 5 is preferably a p-type semiconductor region and the second semiconductor region 3 is preferably an n-type semiconductor region. The n-type semiconductor region 3, the p-type semiconductor region 5 and the active layer 4 may respectively contain one or multiple layers. The active layer 4 may in particular be designed as a multiple-quantum well layer. The n-type semiconductor region 3 may contain one or multiple n-doped layers and the p-type semiconductor region 5 may contain one or multiple p-doped layers, for example.

In the intermediate step shown in FIG. 2B, starting from the first main surface 14 adjoining the first semiconductor region 5, the first recesses 11 have been produced by an etching process. The first recesses 11 have a width $b_1$ of 20 µm to 50 µm as well as a depth $t_1$ of 0.1 µm to 10 µm. By a suitable mask layer, oblique side surfaces 11A can be produced when etching the first recesses 11 so that the recesses 11 have a trapezoid cross-sectional area, for example.

In the further intermediate step illustrated in FIG. 2C, second recesses 12 have been produced in the center of the previously produced first recesses 11 by a second etching process, which, in contrast to the first recesses 11, extend through the active layer 4 into the n-type semiconductor region 3. The second recesses 12 preferably have a width $b_2$ of 2 µm to 20 µm, as well as a depth $t_2$ of 0.1 µm to 10 µm. By a suitable mask layer, oblique side surfaces 12A can be produced during etching of the second recesses 12 so that the second recesses 12 have a trapezoid cross-sectional area, for example.

In the further method step illustrated in FIG. 2D, the inner surfaces of the recesses 11, 12 have been coated with an electrically-insulating layer 6 such as a silicon oxide layer or silicon nitride layer, for example. Furthermore, a mirror layer 7 has been applied to the electrically insulating layer 6 as well as to the regions remaining next to recesses 11, 12 of the first main surface 14 of the semiconductor layer sequence 2. The mirror layer 7 is a reflecting metal layer electrically contacting the p-type semiconductor region 5 on the first main surface 14 of the semiconductor layer sequence 2. The mirror layer 7 in particular comprises gold, silver or aluminum.

Figure 2E:
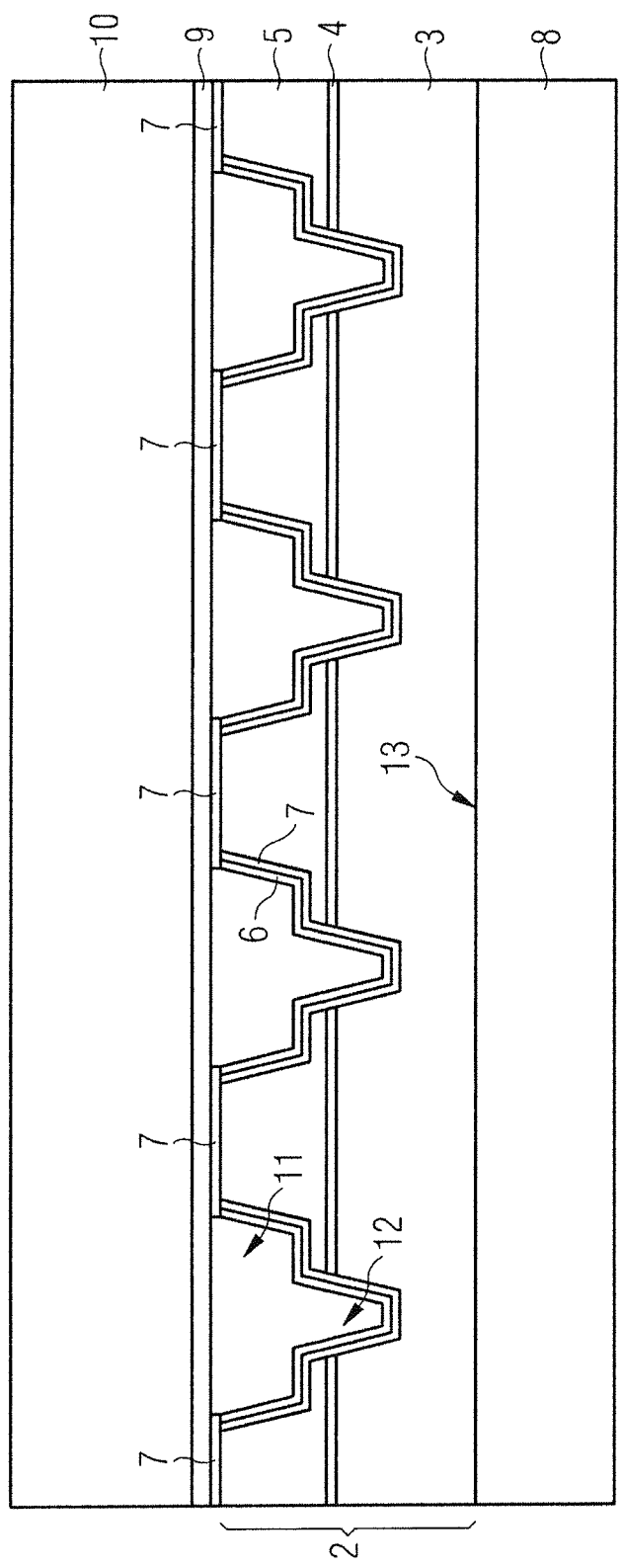

In the further method step illustrated in FIG. 2E, the semiconductor layer sequence 2 has been connected to a carrier substrate 10 by a bonding layer 9 such as a solder layer, for example. It is possible for one or multiple intermediate layers to be arranged between the carrier substrate 10 and the bonding layer 9 or for one or multiple intermediate layers to be arranged between the bonding layer 9 and the mirror layer 7, these intermediate layers acting as adhesive layer, wetting layer or diffusion barrier layer, for example.

To finish the optoelectronic semiconductor chip 1 illustrated in FIG. 1, the growth substrate 8 on the second main surface 13, which is opposite the carrier substrate 2, of the semiconductor layer sequence 10 is subsequently removed, wherein in the finished semiconductor chip, the second main surface 13 acts as a radiation exit surface 13. Furthermore, an electric connecting layer 15 is applied to sub-regions of the radiation exit surface 13 and a further electric connecting layer 16 is applied to the rear side of the carrier substrate 10, for example.

FIG. 3 illustrates a second example of the optoelectronic semiconductor chip 1. This example differs from the example illustrated in FIG. 1 in the way the recesses 11, 12 are formed in the semiconductor layer sequence 2. In the second example illustrated herein, the second recesses 12 are not directly adjacent to the first recesses 11. Rather, the second recesses 12 separating the first semiconductor region 5 and the active layer 4 are arranged between two first recesses 11 extending from the first main surface 14 of the semiconductor layer sequence 2 into the first semiconductor region 5, but do not separate the active layer 4.

When viewed from a lateral direction, the second recesses 12 are each enclosed by a first recess 11, wherein the first recesses 11 arranged on both sides of the second recess 12 preferably have a center-to-center distance of between 20 µm and 50 µm. The width of the first recesses 11 and the second recesses 12 may be 2 µm to 20 µm, for example. The first recesses advantageously have a depth of 0.1 µm to 10 µm, preferably 0.25 µm to 2.5 µm. The depth of the second recess 12 is selected such that the second recesses 12 completely penetrate the first semiconductor region 5 and the active layer 4, wherein the first semiconductor region 5 has a thickness of about 2 µm to 3 µm and the active layer 4 may have a thickness of 100 nm to 1000 nm.

The first recesses 11 and the second recesses 12, respectively, have a trapezoid cross-sectional surface with oblique side surfaces 11A, 12A. In particular, the first recesses 11 and the second recesses 12 each have the shape of prisms with trapezoid cross-sections.

Just like in the first example, the inner surfaces of the recesses 11, 12 are each covered by an electrically-insulating layer 6 that may be a silicon oxide layer or a silicon nitride layer, for example. A mirror layer 7 is applied to the electrically insulating layer 6 and sub-regions of the first main surface 14 facing the carrier substrate 10 of the semiconductor layer sequence 2, with the mirror layer assuming the function of an electrical contact layer on the first main surface 14 of the semiconductor layer sequence 2 at the same time.

The regions of the first main surface 14 of the semiconductor layer sequence 2 that are arranged between a second recess 12 and a neighboring first recess 11 are not electrically contacted. These regions are not covered by the mirror layer 7 acting as an electrical contact layer, for example. This way, no current is injected into the regions of the semiconductor layer sequence 2, which comprise a second recess 12, the two neighboring first recesses 11 and the intermediate spaces between the second recess 12 and the neighboring first recesses 11.

Current injection is rather only effected in regions of the semiconductor layer sequence 2 arranged between two first recesses 11, without second recess 12 arranged between them. In the area of the second recess 12, the thickness of the first semiconductor region 5 is reduced by the first recesses 11 arranged next to a second recess 12, thereby reducing the flow of current through the active layer 4 due to the limited cross conductivity of the semiconductor material in the area of the second recesses 12. The reduced flow of current through the active layer 4 in the area of the second recesses 12 comes with the advantage that non-radiating recombinations of charge carriers are reduced in this area.

Further advantages and advantageous configurations of the optoelectronic semiconductor chip 1 of the second example correspond to the above described first example and are therefore not repeatedly explained in detail.

One example of a method of producing the semiconductor chip 1 of FIG. 3 is explained in the following by FIGS. 4A to 4D.

In the intermediate step of the method illustrated in FIG. 4A, the semiconductor layer sequence 2 that comprises the first semiconductor region 5, the active layer 4 and the second semiconductor region 3, has been grown onto a growth substrate 8, just as in the first example. Further, the first recesses 11 have been produced by a first etching process. The first recesses 11 have a width of 2 µm to 20 µm as well as a depth $t_1$ of 0.1 µm to 10 µm, for example. While etching the first recesses 11, oblique side surfaces 11A can be produced by a suitable mask layer so that the first recesses 11 have a trapezoidal cross-sectional area, for example. In this example, the first recesses 11 preferably have a center-to-center distance $d_1$ of 20 µm to 50 µm to each other.

In the further intermediate step illustrated in FIG. 4B, second recesses 12 have been produced centrally between the previously produced first recesses 11 by a second etching process, with these second recesses, in contrast to the first recesses 11, extending through the active layer 4 all the way into the n-type-semiconductor region 3. The second recesses 12 preferably have a width of 2 µm to 20 µm. The second recesses are deeper than the first recesses 11, therefore extending deeper into the semiconductor layer sequence 2 and separating the active layer 4. The depth of the second recesses 12 may be 0.1 µm to 10 µm. By a suitable mask layer, oblique side surfaces 12A can be produced while etching the second recesses 12 so that the second recesses 12 have a trapezoidal cross-sectional area, for example.

In the further intermediate step illustrated in FIG. 4C, the inner surfaces of recesses 11, 12 have been coated with an electrically-insulating layer 6 such as a silicon oxide layer or a silicon nitride layer, for example. Furthermore, a mirror layer 7 has been applied to the electrically-insulating layer 6 as well as to regions of the first main surface 14 of the semiconductor layer sequence 2. The mirror layer 7 is a reflecting metal layer electrically contacting the p-type semiconductor region 5 on the first main surface 14 of the semiconductor layer sequence 2. The mirror layer 7 in particular comprises gold, silver or aluminum. The mirror layer 7 acting as an electrical contact layer is only applied to regions of the first main surface 14 arranged between to first recesses 11, with no second recess 12 being arranged therebetween.

Figure 4D:
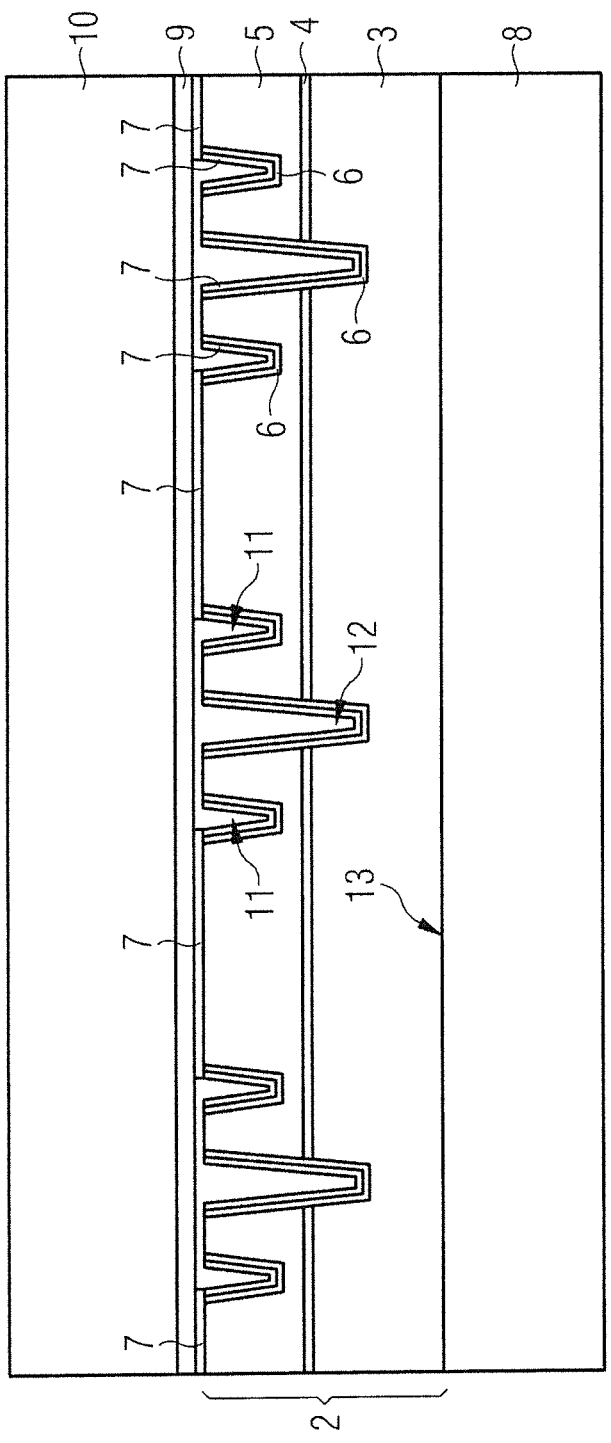

In the further intermediate step illustrated in FIG. 4D, the semiconductor layer sequence 2 has been connected to a carrier substrate 10 by a bonding layer 9 such as a solder layer, for example. It is possible for one or multiple intermediate layers to be arranged between the carrier substrate 10 and the bonding layer 9 or between the bonding layer 9 and the mirror layer 7, these layers acting as an adhesive layer, wetting layer or diffusion barrier layer, for example.

To finish the optoelectronic semiconductor chip 1 illustrated in FIG. 3, the growth substrate 8 on the main surface 13 opposite the carrier substrate 10 of the semiconductor layer sequence 2 is removed afterwards. Furthermore, an electrical connecting layer 15 is applied to sub-regions of the radiation exit surface 13 and another electrical connecting layer 16 is applied to the rear side of the carrier substrate 10.

My chips and methods are not limited by the description by the examples. This disclosure rather comprises every new feature as well as any combination of features, which in particular includes any combination of features in the appended claims, even if the feature or combination per se is not explicitly indicated in the claims or examples.

This application claims priority of DE 10 2014 114 194.6, the subject matter of which is incorporated herein by reference.

The invention claimed is:

1. An optoelectronic semiconductor chip comprising a semiconductor layer sequence and a carrier substrate, wherein the semiconductor layer sequence comprises a first semiconductor region of a first conductivity type, a second semiconductor region of a second conductivity type and an active layer arranged between the first semiconductor region and the second semiconductor region, wherein the first semiconductor region faces the carrier substrate, the semiconductor layer sequence comprises first recesses formed in the first semiconductor region and that do not separate the active layer, the semiconductor layer sequence comprises second recesses that at least partially separate the first semiconductor region and the active layer, the second recesses adjoin a first recess or are arranged between two first recesses, and the first recesses and the second recesses comprise oblique side surfaces that enclose an angle of 30° to 60° with the first main surface of the semiconductor layer sequence facing the carrier substrate.

2. The optoelectronic semiconductor chip according to claim 1, wherein regions of a first main surface of the semiconductor layer sequence arranged between a second recess and a neighboring first recess are not electrically contacted.

3. The optoelectronic semiconductor chip according to claim 1, wherein the first recesses and/or the second recesses have a depth of 0.1 µm to 10 µm.

4. The optoelectronic semiconductor chip according to claim 1, wherein the first recesses and/or the second recesses have a cross-sectional area that decreases from the carrier substrate.

5. The optoelectronic semiconductor chip according to claim 1, wherein the first recesses and/or the second recesses have a trapezoidal cross-sectional area.

6. The optoelectronic semiconductor chip according to claim 1, wherein the first recesses and/or the second recesses are prism-shaped.

7. The optoelectronic semiconductor chip according to claim 1, wherein the first recesses have a greater width than the second recesses, and the second recesses adjoin a first recess when viewed from the carrier substrate in each case in a vertical direction.

8. The optoelectronic semiconductor chip according to claim 1, wherein the first recesses have a width of 20 µm to 50 µm and the second recesses have a width of 2 µm to 20 µm.

9. The optoelectronic semiconductor chip according to claim 1, wherein the width of the first recesses is greater than a width of the second recesses by at least 10 µm.

10. The optoelectronic semiconductor chip according to claim 1, wherein the second recesses do not directly adjoin the first recesses and are each arranged between two of the first recesses.

11. The optoelectronic semiconductor chip according to claim 10, wherein the first recesses have a lateral distance of at least 20 µm and 50 µm at the most, and the second recesses have a width of 2 µm to 20 µm.

* * * * *